(12) United States Patent
Ning et al.

(10) Patent No.: US 9,791,772 B2
(45) Date of Patent: Oct. 17, 2017

(54) MONITORING PATTERN FOR DEVICES

(71) Applicant: GLOBALFOUNDRIES Singapore Pte. Ltd., Singapore (SG)

(72) Inventors: Guoxiang Ning, Ballston Lake, NY (US); Paul Ackmann, Gansevoort, NY (US); Byoung Il Choi, Gyeonggi-do (KR)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 216 days.

(21) Appl. No.: 14/084,552

(22) Filed: Nov. 19, 2013

(65) Prior Publication Data

US 2014/0273310 A1    Sep. 18, 2014

Related U.S. Application Data

(60) Provisional application No. 61/781,143, filed on Mar. 14, 2013.

(51) Int. Cl.
*G03F 1/78* (2012.01)
*G03F 1/44* (2012.01)

(52) U.S. Cl.
CPC .................................... *G03F 1/44* (2013.01)

(58) Field of Classification Search
CPC ..................................... G03F 1/38; G03F 1/44
USPC ............................................................... 430/5
See application file for complete search history.

(56) References Cited

U.S. PATENT DOCUMENTS

| 5,136,169 A | 8/1992 | Smith et al. |
| 6,063,531 A | 5/2000 | Singh et al. |
| 6,701,512 B2 * | 3/2004 | Sutani ................. G03F 7/70641 |
| | | 250/491.1 |
| 2011/0318673 A1 * | 12/2011 | Hung ........................ G03F 1/44 |
| | | 430/5 |

* cited by examiner

*Primary Examiner* — Daborah Chacko Davis
(74) *Attorney, Agent, or Firm* — Horizon IP Pte. Ltd.

(57) ABSTRACT

Reticle and methods for forming a device or reticle are presented. A reticle is provided with a device pattern and a first monitoring pattern. The first monitoring pattern includes a plurality of first test cells having a first test cell area and a first test pattern. The first test cells have different first pitch ratios to an anchor pitch and the first test pattern fills the first test cell area of a first test cell. A wafer with a resist layer is exposed with a lithographic system using the reticle. The resist is developed to form a patterned resist layer on the wafer and the wafer is processed using the patterned resist layer.

13 Claims, 12 Drawing Sheets

MONITORING PATTERN FOR DEVICES

BACKGROUND

Reticles or photomasks are used in lithographic processes for forming integrated circuits. For example, a pattern on a photomask is imaged and transferred onto a chemically amplified resist on a surface of the substrate. The patterned resist is then used to pattern one or more layers on a substrate to form desired features. Imaging errors occur due to limitations of light. For example, irregularities, such as line widths which are narrower or wider line widths than designed, may occur. Such irregularities are a result of proximity effect. To compensate for imaging errors, optical proximity correction (OPC) is employed.

Reticles, such as EUV reticles, used in lithography are generally formed by electron-beam (e-beam) patterning. Proximity effect correction of e-beam is based on monitoring of test patterns. However, conventional test patterns used for monitoring proximity effects have a narrow writing density variation range. Since e-beam dose is dependent on the writing density, conventional test patterns provide information only within a small dose variation range, limiting their effectiveness. Additionally, the CD or pitch provided by conventional test patterns is different from that of real production devices. Also, conventional test patterns are without pattern classification and bias compensation table.

From the foregoing discussion, it is desirable to provide monitoring patterns with wider writing density variation range.

SUMMARY

Embodiments generally relate to devices and methods for forming a device. In one embodiment, a method for forming a device is presented. A reticle is provided with a device pattern and a first monitoring pattern. The first monitoring pattern includes a plurality of first test cells having a first test cell area and a first test pattern. The first test cells have different first pitch ratios to an anchor pitch and the first test pattern fills the first test cell area of a first test cell. A wafer with a resist layer is exposed with a lithographic system using the reticle. The resist is developed to form a patterned resist layer on the wafer and the wafer is processed using the patterned resist layer.

In another embodiment, a method for forming a reticle is disclosed. A reticle blank having a frame region and a prime region is provided. A pellicle which surrounds the reticle blank is provided. The pellicle includes a reticle monitoring pattern. The reticle monitoring pattern includes a plurality of reticle test cells having a reticle test cell area and a reticle test pattern. The reticle test cells have different reticle pitch ratios to an anchor pitch and the reticle test pattern fills the reticle test cell area of a reticle test cell. The reticle is patterned using electron-beam and the reticle monitoring pattern is monitored for PEC of the electron beam.

In yet another embodiment, a reticle is presented. The reticle includes a prime region and a frame region surrounding the prime region. The prime region includes a pattern of a device layer. The reticle includes a wafer monitoring pattern disposed in the prime and frame regions. The wafer monitoring pattern includes a plurality of wafer test cells having a wafer test cell area and a wafer test pattern. The wafer test cells have different wafer pitch ratios to an anchor pitch and the wafer test pattern fills the wafer test cell area of a wafer test cell.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2$a$-2$d$ and 3$a$-3$d$ show various embodiments of test structure cells;

FIGS. 4$a$-4$c$ show exemplary embodiments of a reticle sub-system;

FIGS. 5$a$-5$b$ show graphs of e-beam writing density and dose relationships; and FIGS. 6$a$-6$c$ show embodiments of processes for semi-OPC, OPC and semi-OPC/OPC flows.

DETAILED DESCRIPTION

Embodiments generally relate to devices, for example, semiconductor devices or integrated circuits (ICs). The ICs can be any type of IC, such as dynamic or static random access memories, signal processors, microcontrollers or system-on-chip (SoC) devices. The devices or ICs can be incorporated into or used with, for example, consumer electronic products, such as computers, cell phones, and personal digital assistants (PDAs).

The fabrication of ICs involves the formation of features on a substrate that make up circuit components, such as transistors, resistors and capacitors. The devices are interconnected, enabling the IC to perform the desired functions. To form the features and interconnections, layers are repeatedly deposited on the substrate and patterned as desired using lithographic techniques. For example, a wafer is patterned by exposing a photoresist layer with the pattern on a reticle with an exposure source. After exposure, the photoresist layer is developed, where the pattern of the reticle is transferred to the photoresist, and a photoresist etch mask is created. An etch is performed using the etch mask to replicate the pattern on the wafer below, which may include one or more layers, depending on the stage of the process. In the formation of an IC, numerous reticles may be used for different patterning processes. Furthermore, a plurality of ICs may be formed on the wafer in parallel.

Figure 1:
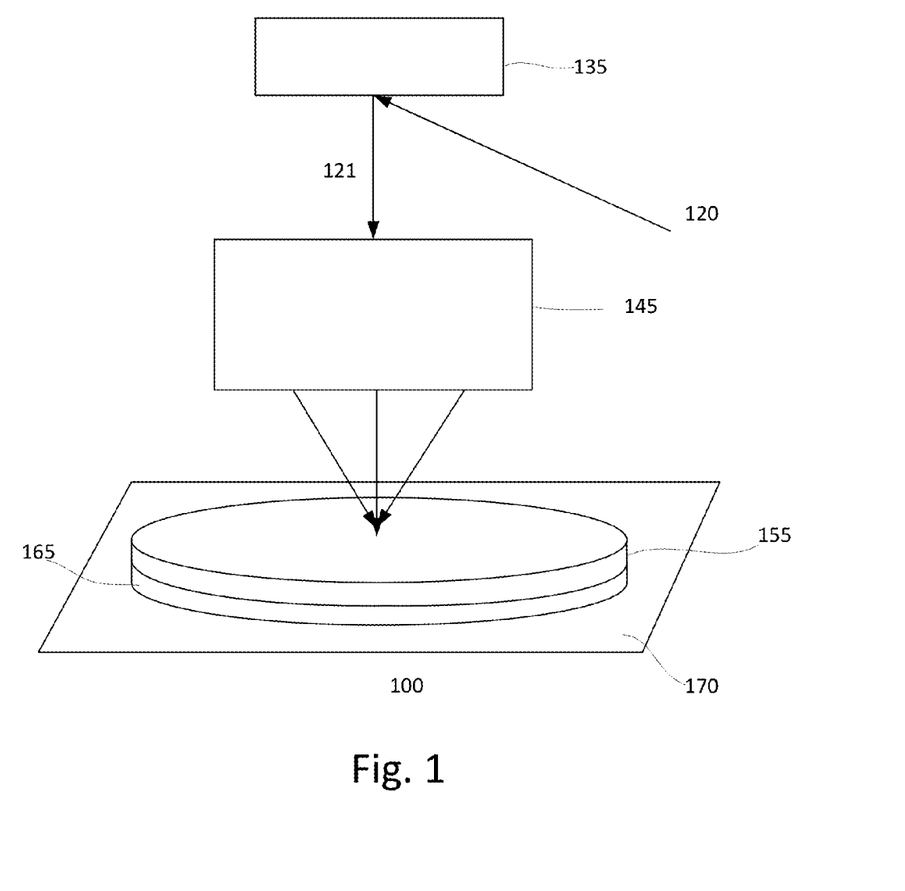
FIG. 1 shows an example of a photolithography system used for patterning a wafer.

FIG. 1 shows an example of a portion of an exemplary photolithography system 100 used for patterning a wafer to form features, such as circuit components. The photolithography system may include, exposure, beam shaping and illumination sub-systems (not shown). The exposure sub-system, for example, includes an exposure source for generating electromagnetic radiation (EMR). In one embodiment, the EMR is used in extreme ultra-violet (EUV) lithography. The EMR is passed through the beam shaping sub-system, which may include a collimator and monochromator to prepare an EMR beam (e.g., EMR operating beam). The EMR operating beam is passed through the illumination sub-system. The illumination sub-system, for example, may include mirrors and/or lenses. The illumination sub-system conducts the EMR operating beam 120 to a mask or reticle 135 having a desired pattern (e.g., mask pattern).

In one embodiment, the reticle is a reflective mask or reticle employed in, for example, EUV lithography. The illumination sub-system conducts the EMR operating beam onto the active surface of the reticle having the mask pattern. The reticle reflects the EMR operating beam from its active surface. The reflected EMR beam 121 is a patterned beam having the pattern of the reticle. Other types of reticles, such as non-reflective or transmission reticles, can also be employed.

The patterned beam is projected onto the wafer 165. In one embodiment, the wafer is disposed on a translation stage 170. In one embodiment, the patterned beam is projected onto the wafer by a projection sub-system 145. The projection sub-system may include mirrors and/or lenses for projecting the patterned beam onto a portion of the wafer. The wafer includes a photoresist layer 155 which is exposed by the patterned beam. For example, the image of the patterned beam is imaged onto the photoresist layer. The patterned beam exposes a portion of the wafer with the image of the reticle. The exposed portion corresponds to a device region on which a device is formed. After exposing the portion, the stage may be translated to expose a next portion of the wafer. The exposure process repeats until the complete wafer is exposed. Processing a wafer using other types of lithographic systems may also be useful.

After the wafer has been exposed, the photoresist is developed, transferring the pattern of the reticle to the resist layer. An anti-reflective coating (ARC) may be provided beneath the resist layer to improved lithographic resolution. The patterned resist layer serves as an etch mask, such as an RIE etch mask to pattern the wafer. Depending on the stage of process, the etch may etch a bare wafer, a layer on the wafer, or multiple layers on the wafer. In the fabrication of an IC, numerous patterning processes utilizing different reticles may be performed. After processing of the wafer is completed, the wafer is diced along the dicing channel (or kerf) to produce individual dies or ICs. The dies are packaged to form chips. In some embodiments, wafer level packaging may be performed prior to dicing the wafer. Other configurations of packaging the ICs may also be useful.

A monitoring pattern is provided. The monitoring pattern is used to monitor proximity effect (PE). The monitoring pattern may be employed for proximity correction (PC), such as optical proximity correction (OPC) or e-beam proximity effect correction (PEC). Employing the monitoring patterns for other types of PCs may also be useful.

The monitoring pattern includes a plurality of test cells. In one embodiment, the monitoring pattern includes a set of test cells. The set of test cells includes a test pattern. The test pattern, for example, may include features, such as straight lines, lines with angles, or an array of vias. Other types of test patterns may also be useful. For example, the features are separated by spaces. The test pattern of a set is the same. The set of test cells has the same pattern.

In one embodiment, test cells of the set have same cell area or cell size. The cell size, in one embodiment, is less than 10 µm by 10 µm. For example, the cell size may be about 5 µm by 5 µm. Providing other cell sizes may also be useful. For example, the other cell sizes less than 10 µm by 10 µm may be used. The cell area of a cell, in one embodiment, is completely filled with the test pattern. As discussed, the test cells of the set have the same test pattern. However, different cells of the set have different pitches. For example, different cells have different critical dimension to pitch (CDTP) ratio to the anchor or design pitch. As such, the cells of a set, although have the same test pattern, may have different number of features due to the fact that the cells have the same area and are completely filled with features. For example, a cell with a smaller pitch will have more test features than that with a larger pitch. The cells of a set preferably should be designed with number of cells and pitches to enable adequate monitoring of dense and isolated biases.

As discussed, the test cells of a set have the same size but different number of features. For example, the test cells of a set have different number of lines due to the different CDTP ratios. In one embodiment, the CDTP ratios to the anchor pitch and cell size are selected to reflect the different densities in a real production device. For example, the CDTP ratios should reflect dense, semi-dense and isolated patterns in a real production device. The anchor pitch density should reflect the dense patterns. For example, the anchor pitch can be close to density of a static random access memory (SRAM) device. Cells having CDTP ratio to the anchor pitch greater than 1 reflects semi-dense and isolated densities. Providing CDTP ratio to anchor pitch less than 1 reflects a higher density than the anchor pitch. The present monitoring pattern advantageously produces a large writing density variation range. For example, the set of cells enables up to 45% or more for CDTP monitoring and up to 45% or more for inverse CDTP monitoring.

In one embodiment, different monitoring patterns may be provided. For example, a first monitoring pattern with a set of test cells having line features and a second monitoring pattern with a set of test cells having via features may be provided. Providing additional or other monitoring patterns may also be useful. A monitoring pattern may be provided for a reticle. Different reticles may have different monitoring patterns. The type of monitoring pattern may depend on the level of the reticle. For example, a reticle for a metal line level may be provided with a monitoring pattern having line features while a reticle for a via level may be provided with a monitoring pattern having via features. Other reticles may be provided with other types of monitoring patterns. The monitoring pattern may be based on negative tone development (NTD), positive tone development (PTD) or a combination thereof. In some cases, a set of test cells may also include test cells with the inverse pattern. For example, the set of test cells includes a first sub-set of positive test cells and a second sub-set with negative or inverse test cells. The pattern of the negative test cells is the reverse of the positive test cells. For example, features in the positive test cell are replaced with spaces in the negative test cell while spaces in the positive test cell are replaced with features in the negative test cell. The number of positive and negative test cells in the set need not be the same nor have the same pitch.

Figure 2A:
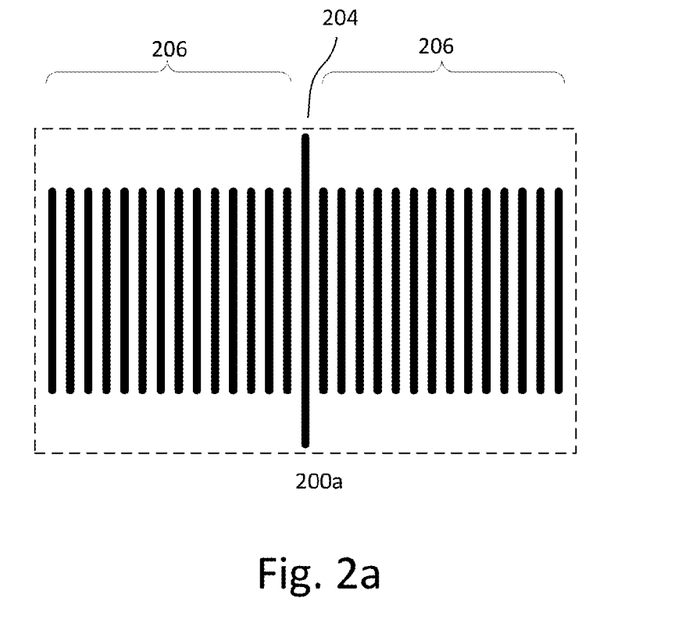
Figure 2B:
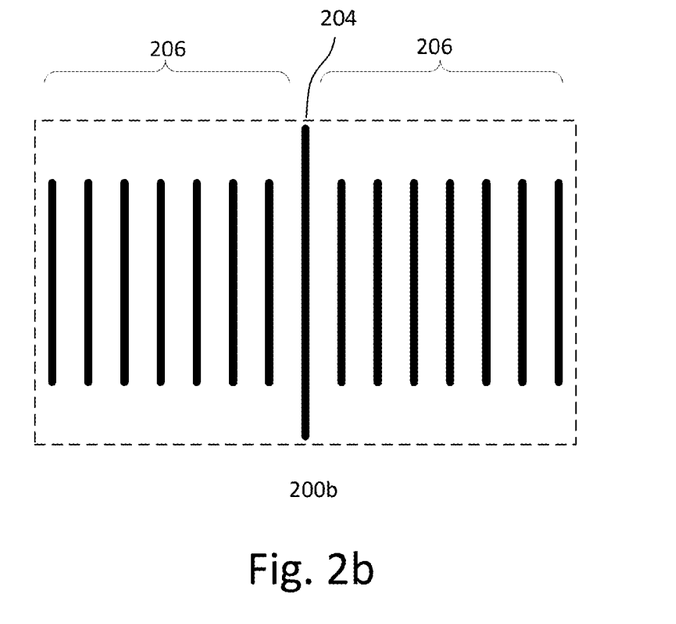
Figure 2C:
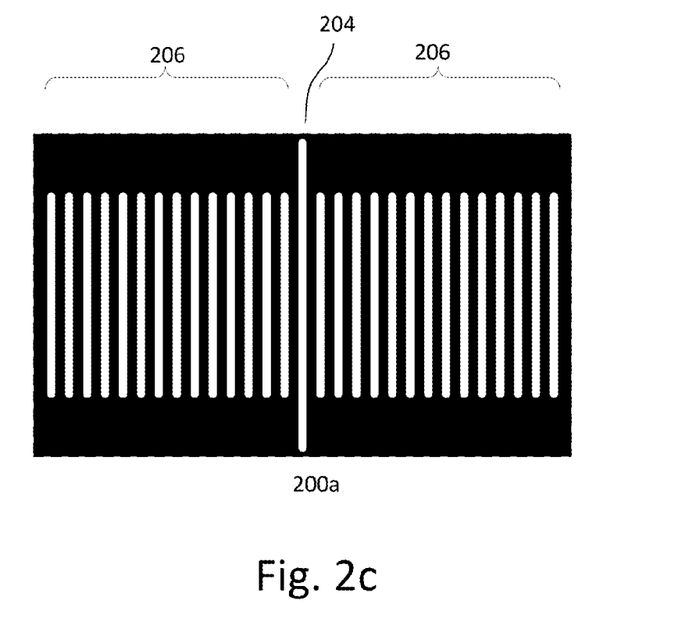
Figure 2D:
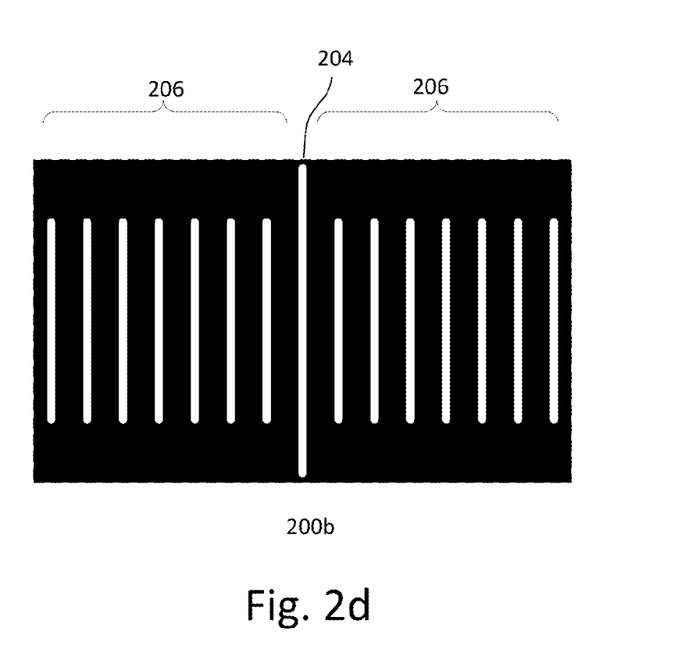

FIGS. 2a-2d and 3a-3d show exemplary test cells. Referring to FIGS. 2a-2b, test cells 200a-200b belonging to a set are shown. The test cells include line features or line patterns. The test cells with line features may be used for line levels or layers. In one embodiment, the line pattern includes a center line feature 204 with first and second sub-sets of line features 206 disposed on the sides of the center line. As shown, the center line feature is longer than the line features on the sides. Other configurations of line patterns or feature patterns may also be useful. The pitch of the pattern in FIG. 2a, for example, may be the anchor or design pitch while that shown in FIG. 2b may be twice the anchor pitch. The sub-set of line features with 2 times the anchor pitch pattern has half the number of line features as that of the subset features with the anchor pitch pattern. FIGS. 2c-2d show negative test cells of FIGS. 2a-2b.

Figure 3A:
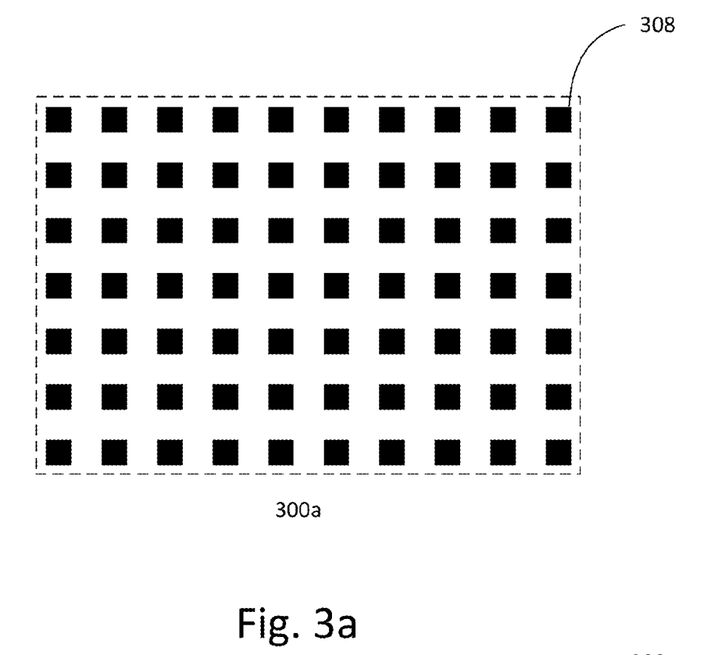
Figure 3B:
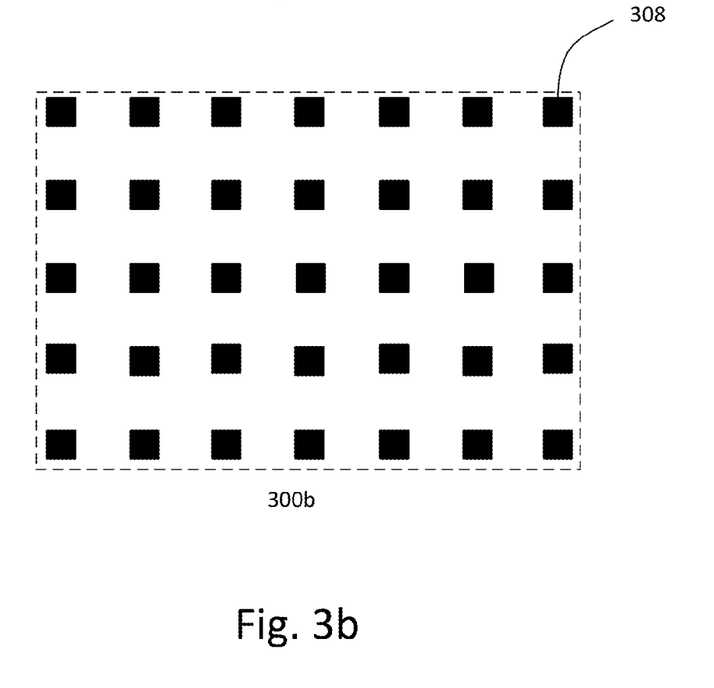
Figure 3C:
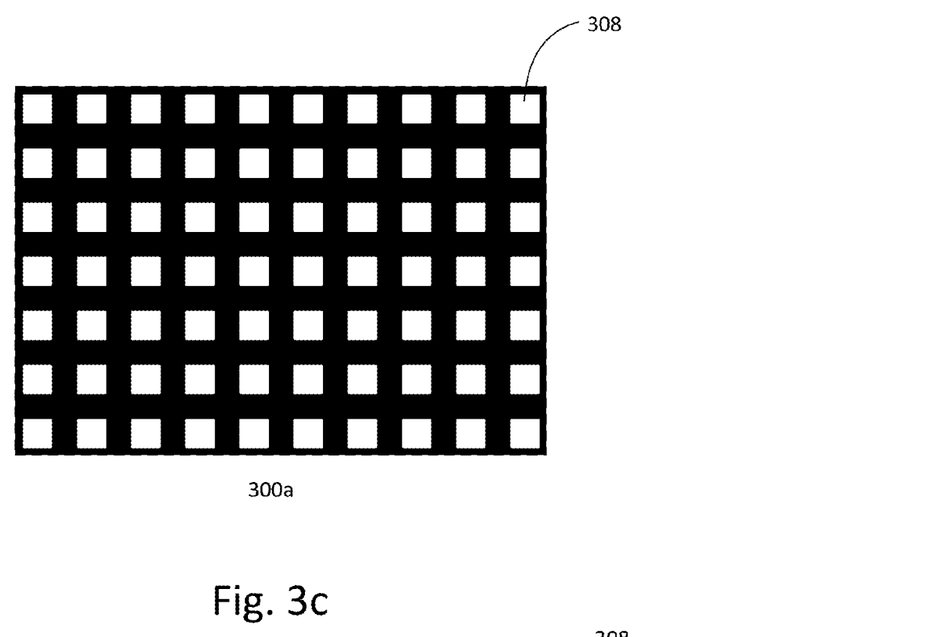
Figure 3D:
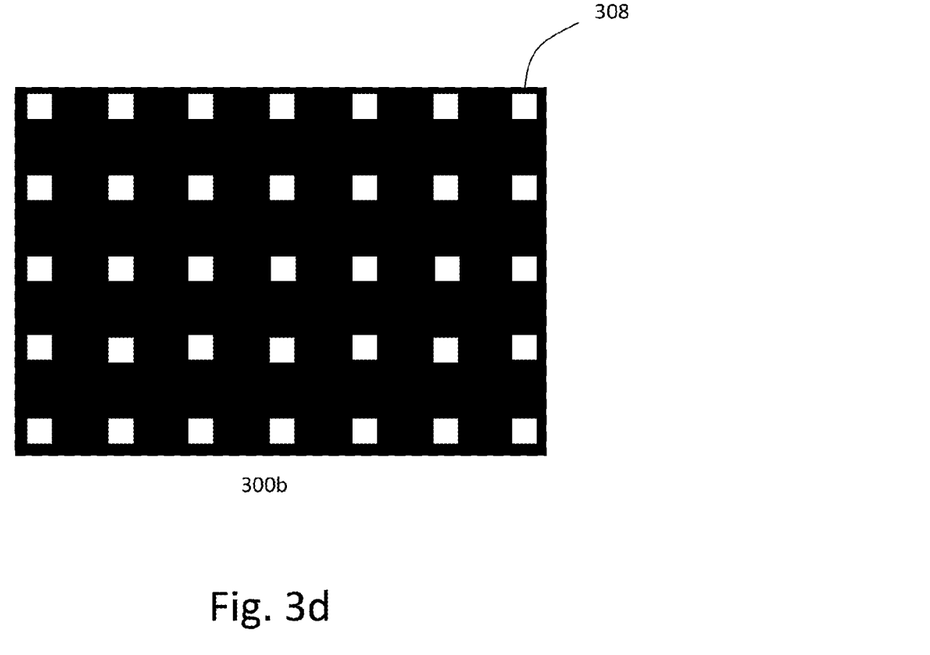

Referring to FIGS. 3a-3b, test cells 300a-300b of a set are shown. The test cells include via features 308. The test cells with via features may be used for via levels or layers. The vias, in one embodiment, are arranged in an array. Other configurations of via patterns or feature patterns may also be useful. The pitch of the via pattern in FIG. 3a, for example, may be the anchor pitch while that shown in FIG. 3b may be about 1.3 times the anchor pitch. The sub-set of via features with 1.3 times the anchor pitch pattern has less number of vias than that of the anchor pitch pattern. For via layers, it may not be required to monitor the inverse CDTP. As such, the test cells shown in FIGS. 3a-3b are for negative tone reticle process of via layers while those shown in FIGS. 3c-3d are for positive tone development. In some cases, if inverse CDTP is desired, FIGS. 3a-3b show positive test cells while FIGS. 3c-3d show corresponding negative test cells. Although two types of test cells are described, it is understood that additional or other types of test cells may be provided.

As an example, a set may have a positive sub-set of cells with CDTP ratio of 0.9, 1.0, 1.2, 1.3, 1.6, 2.0, 4.0, 6.0, 10.0 and 20.0 and a negative sub-set of cells with CDTP ratio of 1.3, 1.6, 2.0, 6.0, 10.0 and 20.0. This results in a set having 16 test cells. Providing a set with other number of cells and/or other CDTP ratios may also be useful. In one embodiment, the set may have positive and negative sub-sets with via features. In another embodiment, a set may just have the positive test cells with CDTP ratio of 0.9, 1.0, 1.2, 1.3, 1.6, 2.0, 4.0, 6.0, 10.0 and 20.0. This results in the set having 10 test cells. For example, the set may just have positive cells with via features.

It is understood that a set of cells may have other number of cells. For example, a set may have more or less than the number of cells described. The number of test cells in a set is directly related to monitoring accuracy. For example, the larger the number of test cells in a set, the greater the monitoring accuracy and vice-versa. However, more cells require additional area to accommodate the additional cells. The number of cells in a set may depend on the area available for the monitoring patterns.

In a preferred embodiment, the minimum ratio of cells to the anchor pitch is 20 to 1. For example, 10 cells are included in a set, which includes dense, semi-dense and isolated patterns. The 10 cells, for example, are positive cells for CDTP monitoring. In the case of line features, additional negative cells may be provided for inverse CDTP monitoring. For example, 6 negative cells are provided for inverse CDTP monitoring. If not enough area is available, only positive cells are provided for CDTP monitoring. In the case of test cells with via features, inverse cells are normally not required for inverse CDTP. As such, only positive via test cells for CDTP monitoring are generally provided.

The monitoring pattern, in one embodiment, can be designed for different types of layers as well as technology node. For example, a monitoring pattern is tailored for an individual layer and the technology node. The monitoring pattern includes test patterns that approximate density variations of real production devices. In one embodiment, the monitoring pattern includes test cells with CDTP ratios to anchor pitch which approximate the density variations of real production devices. For example, the anchor pitch approximates the density of real production SRAM.

In a preferred embodiment, different sets of test cells with different features have the same cell size. Additionally, the different sets of test cells preferably have the same number of test cells with the same pitch configuration. However, it is understood that different sets of test cells may have different sizes, pitch configuration or different number of test cells.

Figure 4A:
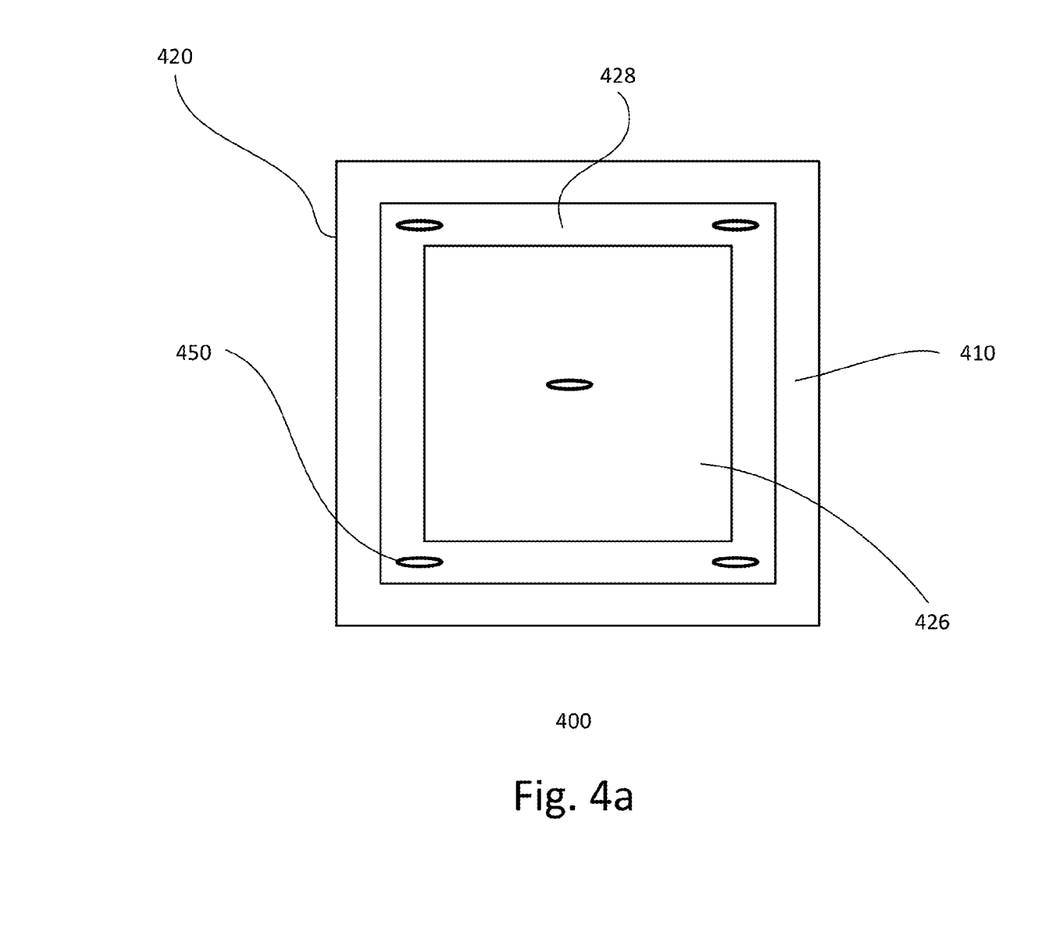
Figure 4B:
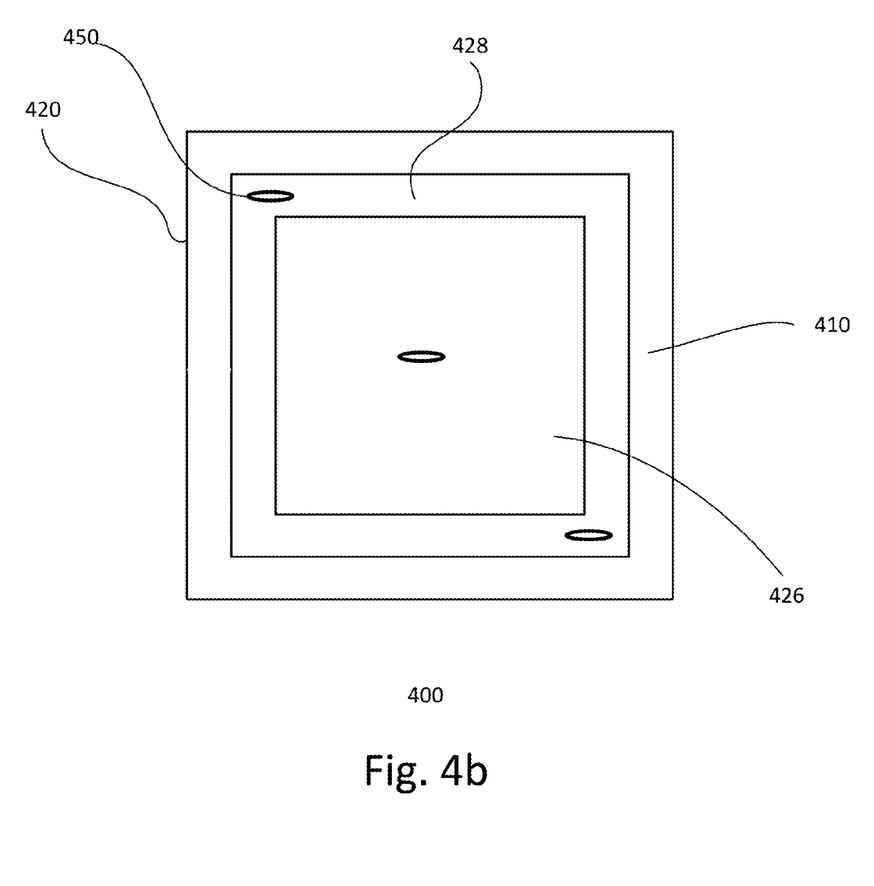
Figure 4C:
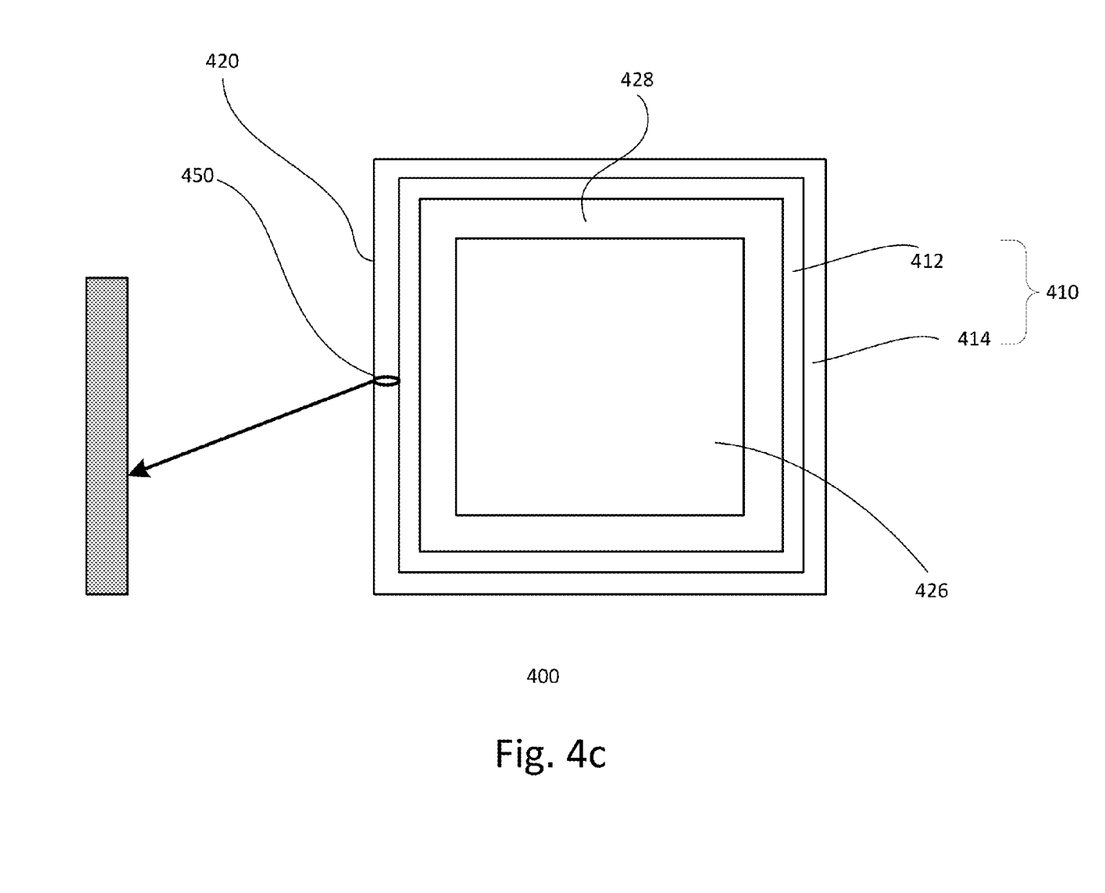

The monitoring patterns may be employed for wafer and reticle proximity monitoring. For example, the monitoring patterns may be used for OPC and PEC. FIGS. 4a-4c show exemplary reticle sub-systems 400 of a lithographic system. As shown, a reticle system includes a reticle 420. In one embodiment, the reticle includes various regions defined thereon. For example, the reticle includes a frame region 428 surrounding the prime region 426. The prime region is the device region. For example, features corresponding to the device, such as transistors and interconnects are located in the prime region. As for the frame region, it corresponds to, for example, dicing channels on the wafer. The frame and prime regions form a scanner region of the reticle. For example, patterns in the scanner region are printed onto the wafer.

Surrounding the frame region is an external region 410 of the reticle. The external region is a region outside of the scanner region for printing the pattern of the reticle onto a wafer. The external region forms a non-scanner region of the reticle. Contents on the reticle in the scanner region are not printed onto the wafer. The external region includes a non-pellicle sub-region 414 surrounding a pellicle sub-region 412. After fabricating the reticle, a pellicle is disposed on the active surface of the reticle in the pellicle sub-region. The pellicle, for example, protects the scanner region of the reticle. The reticle and pellicle may form the reticle sub-system. Outside the pellicle is the non-pellicle sub-region of the external region of the reticle. The various regions of the reticle form concentric region with symmetrical sides. For example, the distance of an outer concentric region to an inner concentric region is the same on all sides. Providing a reticle with various regions which are non-symmetrical or a combination of symmetrical and non-symmetrical may also be useful.

Referring to FIGS. 4a-4b, monitoring blocks 450 may be provided on the reticle for proximity monitoring. For example, the monitoring blocks may be provided in the scanner region of the reticle. The monitoring blocks may be provided in the frame region. For example, monitoring blocks may be located at corners of the frame region, as shown, in FIG. 4a. As shown in FIG. 4b, the monitoring blocks are located at opposing corners of the frame region. Providing monitoring blocks in other locations of the frame region may also be useful. In some cases, a monitoring block may be located in the prime region, if space is permitted. As shown, the monitoring block is located in the middle of the prime region. Providing the monitoring block in other locations in the prime region is also useful. More than one monitoring block may be located in the prime region. The monitoring blocks may be provided in both the frame and prime regions or in just either the frame or prime region. Other configurations of monitoring blocks may also be useful.

Providing monitoring blocks in the scanner region of the reticle enables wafer and reticle monitoring. To perform both wafer and reticle monitoring, respective monitoring blocks are provided. For example, one monitoring block is allocated to wafer monitoring while another is allocated to reticle monitoring. More than one monitoring block may be allocated for wafer and reticle monitoring. In the case where only one block is provided, it may be used for wafer or reticle monitoring.

As shown in FIG. 4c, a monitoring block 450 is disposed in the non-pellicle sub-region of the external region of the reticle or reticle sub-system. Providing the monitoring block in the non-pellicle sub-region outside of the pellicle sub-region enables only reticle monitoring. For example, the process of fabricating a reticle in a mask shop can be monitored. As shown, the monitoring block is located on the reticle outside of the pellicle sub-region. For example, the monitoring block is located in the middle of the non-pellicle sub-region. Providing the monitoring block at other locations on the non-pellicle sub-region may also be useful. Additionally, providing monitoring blocks at multiple locations in the non-pellicle sub-region of the external region may also be useful. Monitoring blocks may be provided in any region or regions of the reticle sub-system. For example, monitoring patterns may be provided inside the scanner region (e.g., frame region and/or prime region) and/or outside of the pellicle region.

In one embodiment, a monitoring block is provided in fixed location on the reticle sub-system. Providing the monitoring pattern, for example, in one fixed location facilitates easy monitoring of the monitoring pattern. For example, providing the monitoring pattern in one fixed location outside of the pellicle sub-region enables easy reticle CD measurements for mask houses.

The e-beam writing density and dose relationship can be defined as follows:

$$\text{Dose(writer)} = \frac{\text{Dose(Maximum)}}{1 + 2\eta\mu}$$

where

η is the parameter dependent on reticle blank and resist type; and

μ is dependent on the local pattern density, which is about 20-50 μm range.

Figure 5A:
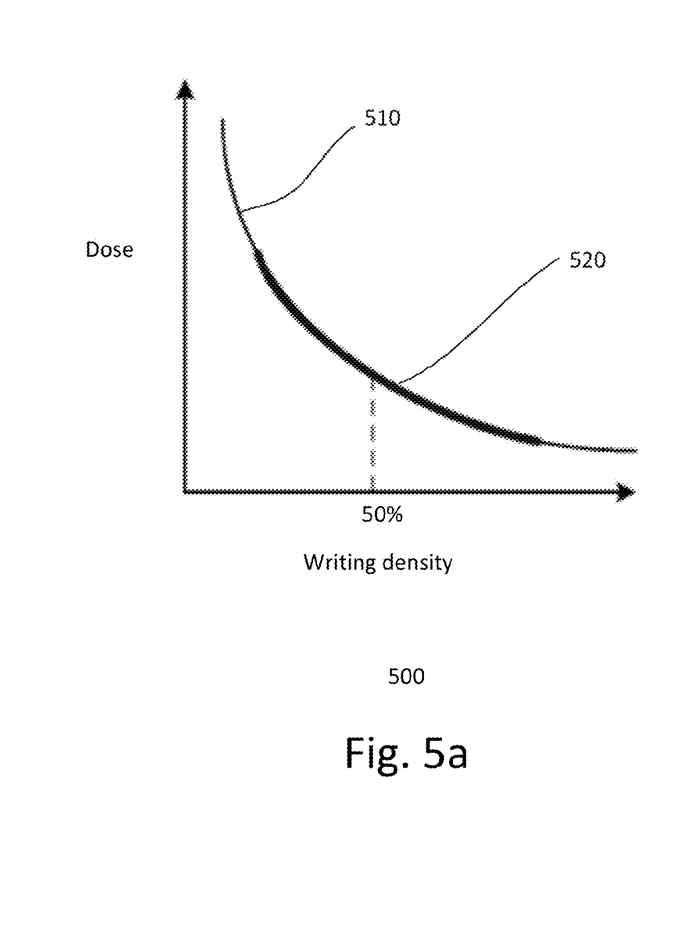
Figure 5B:
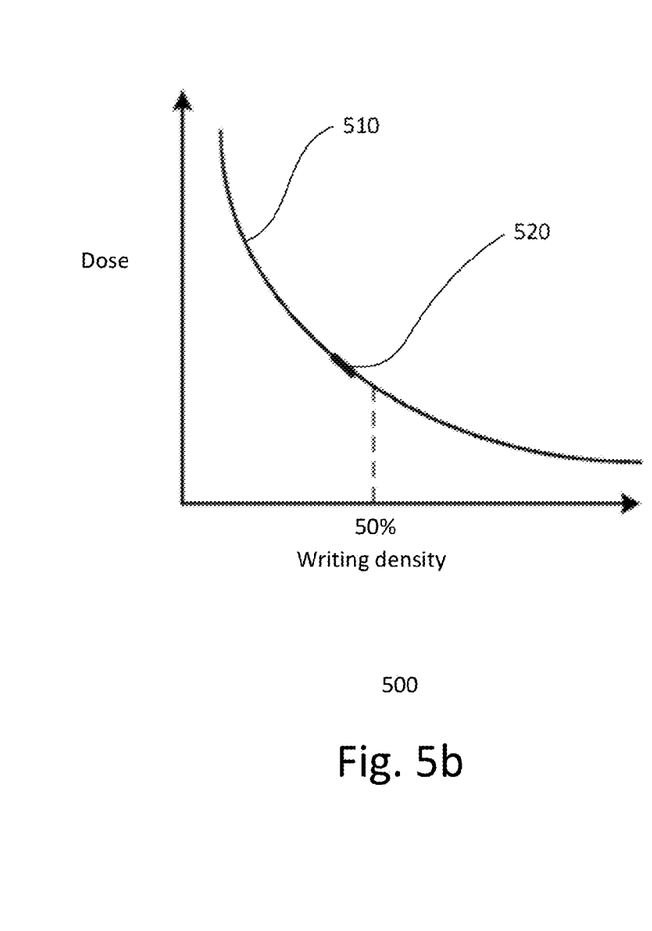

FIGS. 5a-5b show graphs 500 of e-beam writing density and dose relationships. Line 510 represents the e-beam writer dose and writing density relationship. Line 520 within line 510 represents the monitoring pattern writing density variation range. For example, the writing density variation range may be for OPC CDTP or e-beam monitoring. Referring to FIG. 5a, the writing density variation range in accordance to the present monitoring pattern is shown while FIG. 5b shows the writing density variation range by a conventional monitoring pattern (e.g., one which does not have cell areas filled with features). From the graphs, the present monitoring pattern produces a significantly wider writing density variation range as compared to a conventional monitoring pattern. For example, as shown, the present monitoring pattern produces about 9 times wider writing density variation range when compared to a conventional fixed 11 line or space CDTP pattern. The increase of writing density variation range provided by the present monitoring patterns can achieve similar density values as real production SRAM devices. As discussed, the present monitoring patterns provide an increase in writing density variation range. By increasing the variation range, more sampling points can be measured. This provides more accurate resources for mask shop qualification since a much larger range of dose and writing density relationship is available. This enables reticle processes to be matched as close as possible. Additionally, the present monitoring patterns enable monitoring of isolated and dense biasing on the reticle as well as isolated and dense focus monitoring on the wafer. Improved OPC and EPC can be achieved due to larger density variation range. The wider variation range further enables tailoring the thickness of absorber layer for individual reticle blanks, based on the respective layer or level for the EUV blank. Furthermore, providing the present monitoring pattern in the non-pellicle sub-region of the external region creates a fixed reference location, enabling long-term monitoring process of mask shop processes for patterning the reticles.

Figure 6A:
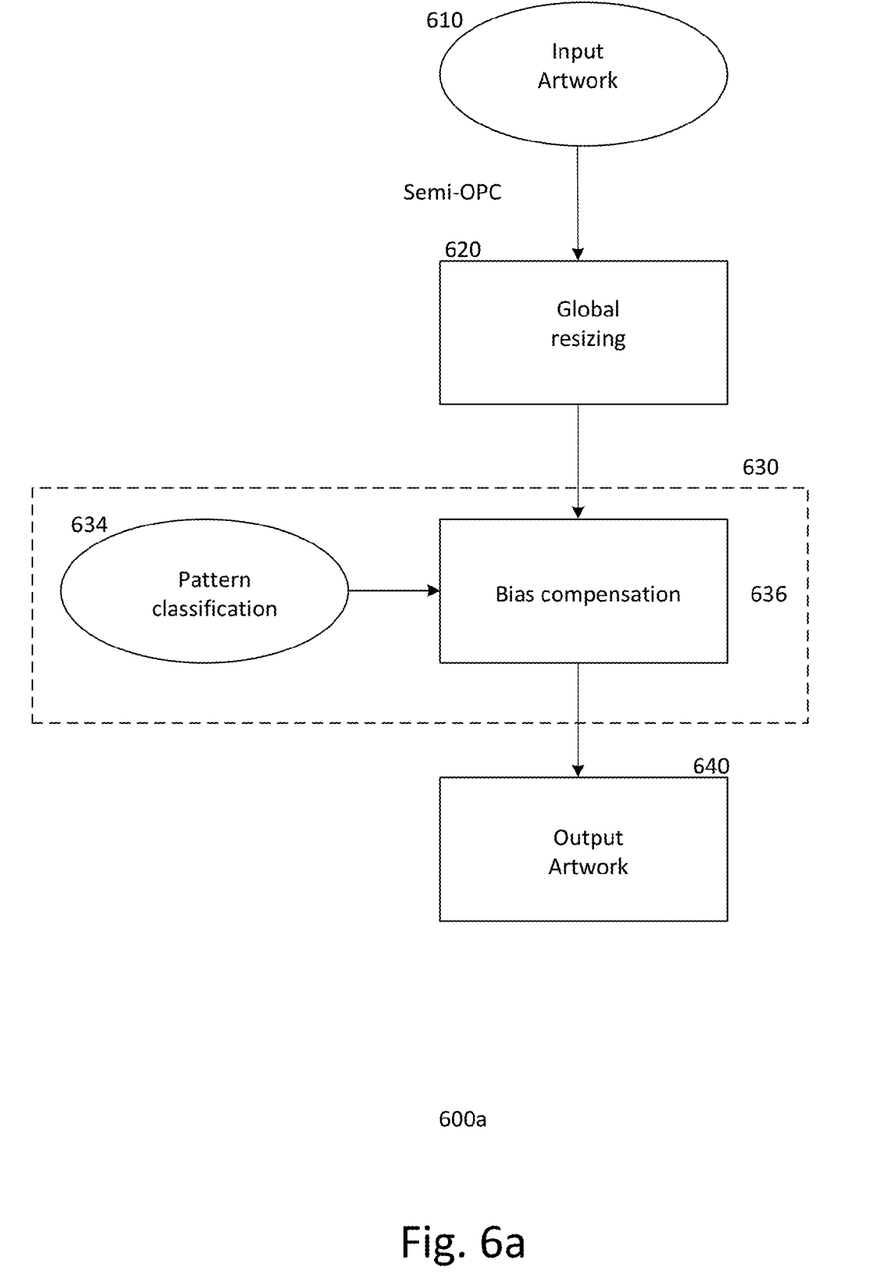

FIG. 6a shows an embodiment of a semi-OPC flow 600a. The semi-OPC flow can be used for wafer monitoring for OPC and reticle monitoring for OPC. For example, semi-OPC can be used for both wafer and reticle monitoring for OPC and PEC. After semi-OPC flow, the CD is the same as or close to after post OPC or run OPC. However, semi-OPC is without assisted features and model based jogs or serifs. The semi-OPC flow begins with providing an input artwork file of the device at step 610. The input artwork file, for example, is a GDS file, such as GDSin. Providing other types of artwork files may also be useful. The input artwork file, in one embodiment, includes monitoring patterns. For example, via levels include a minimum of 10 CDTP ratios to anchor pitch while line levels include a minimum of 16 CDTP ratios to anchor pitch. Providing other number of CDTP ratios to the anchor pitch may also be useful.

At step 620, the artwork file is resized or re-targeted. For example, the artwork file is globally resized based on a set of rules or a model (e.g., rule-based or model-based resizing). For example, the patterns or layout of the device is adjusted globally based on a set of rules or a model. The set of rules or the model may be developed based on historical wafer process information. After global resizing, local resizing is performed at step 630. Local resizing is based on local patterns of the device. Local resizing, in one embodiment, is based on pattern classification 634 and a bias compensation table 636. For example, based on the pattern, such as dense, isolated, or corners, a bias is applied based on the bias compensation table. The bias may be acquired or developed through historical data from processed and/or test wafers. The final CD achieved is close to real post OPC CD without the use of assisting features or scattering bars. An output artwork file is generated based on resizing of the input artwork file at step 640. For example, a GDSout file is generated. The mask shop uses the GDSout to form a mask set. The mask set is used to process a wafer to form devices.

Figure 6B:
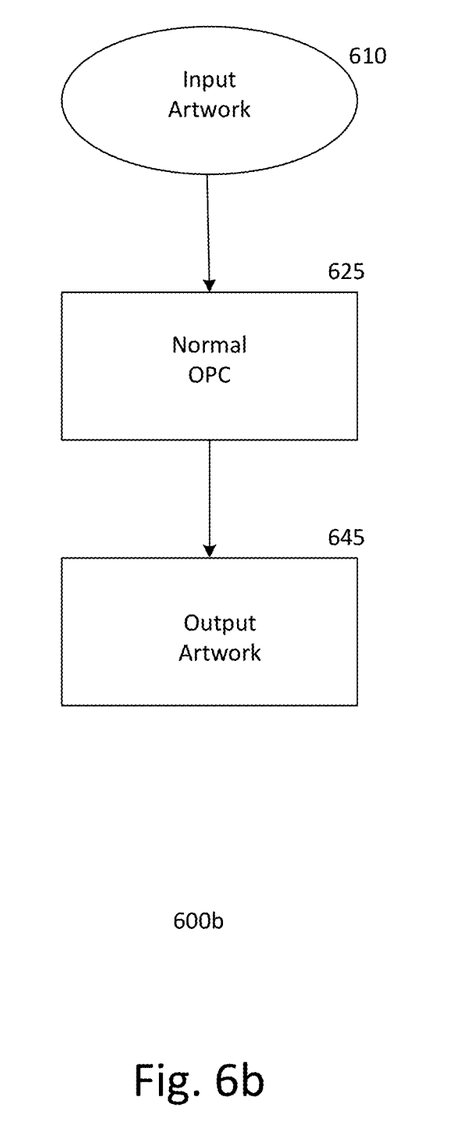

FIG. 6b shows an embodiment of an OPC flow 600b. The OPC flow, for example, is used for wafer monitoring. The OPC flow begins with providing an input artwork file of the device at step 610. The input artwork file, for example, is a GDS file, such as GDSin. Providing other types of artwork files may also be useful. The input artwork file, in one embodiment, includes monitoring patterns. For example, via levels include a minimum of 10 CDTP ratios to anchor pitch while line levels include a minimum of 16 CDTP ratios to anchor pitch. Providing other number of CDTP ratios to the anchor pitch may also be useful.

At step 625, OPC is performed on the artwork file. The OPC is normal OPC. For example, the normal OPC is used to adjust the pattern of the artwork file. The adjusted input artwork file forms an output artwork file at step 645. For example, a GDSout file is generated. The GDSout file is used by a mask shop to fabricate a mask set. The mask set is used to process a wafer to form devices.

Figure 6C:
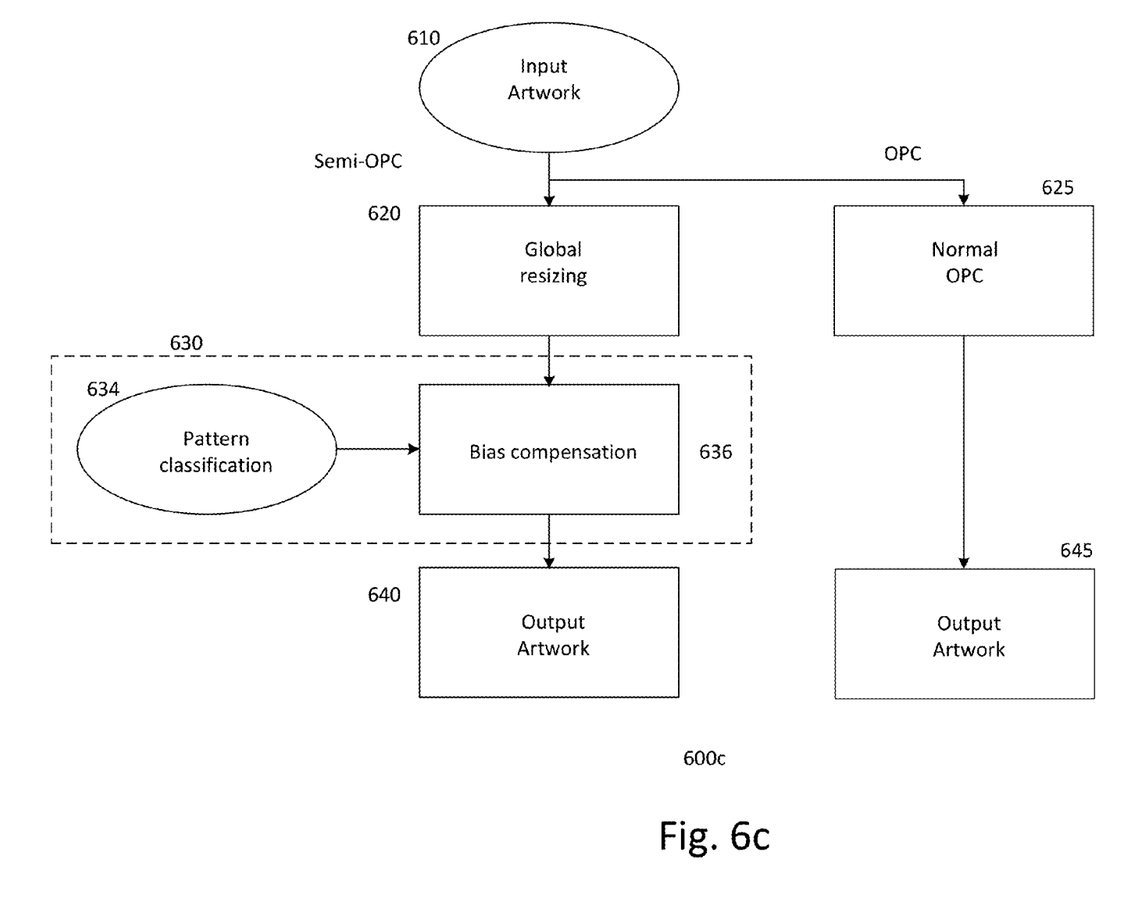

In an alternative embodiment, as shown in FIG. 6c, a flow 600c includes both semi-OPC and OPC blocks, as described in FIGS. 6a-6b. Common elements will not be described or described in detail. Other flows for wafer and reticle monitoring based on the present monitoring patterns may also be useful.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a reticle with a device pattern and a first monitoring pattern, wherein the first monitoring pattern includes a set of first test cells having plurality of first test cells, each of the first test cell comprises a first test cell area and a first test pattern, wherein
the first test cell area is the same for each of the first test cell,
the first test pattern is the same type of test pattern except that the first test patterns of different first test cells have different pitch ratios with respect to an anchor pitch, and
the first test pattern occupies the first test cell area of each of the first test cell;
exposing a wafer with a resist layer with a lithographic system using the reticle;
developing the resist to form a patterned resist layer on the wafer; and
processing the wafer using the patterned resist layer.

2. The method of claim 1 wherein the first test pattern comprises a line pattern with line features separated by spaces.

3. The method of claim 2 wherein first test cells include:
a first sub-group of test cells with the first test pattern; and
a second sub-group of test cells with a negative first test pattern (negative test cells).

4. The method of claim 3 wherein the first test cells comprise a minimum of 16 pitch ratio to the anchor pitch, with the first sub-group comprising 10 test cells and the second sub-group comprising 6 negative test cells.

5. The method of claim 1 wherein the first test pattern comprises a via pattern with via features.

6. The method of claim 5 wherein the first test cells comprise a minimum of 10 pitch ratio to the anchor pitch.

7. The method of claim 1 wherein the first test pattern comprises a line pattern with line features.

8. The method of claim 7 wherein the first test pattern comprises a minimum of 16 pitch ratio to the anchor pitch.

9. The method of claim 1 wherein the reticle comprises:
a prime region in which features corresponding to the device are formed;
a frame region surrounding the prime region, the prime region and frame region form a scanner region of the photolithographic system; and
an external region surrounding the prime region, the external region forms a non-scanner region of the photolithographic system, wherein the external region includes
a pellicle region surrounding the frame region, and
a non-pellicle region surrounding the pellicle region.

10. The method of claim 9 wherein the non-pellicle region comprises:
a reticle monitoring pattern, wherein the reticle monitoring pattern includes a plurality of reticle test cells having a reticle test cell area and a reticle test pattern, wherein
the reticle test cell area is the same for each of the plurality of reticle test cells,
the reticle test pattern for the different reticle test cells is the same except that the reticle test patterns of different reticle test cells have different pitch ratios with respect to a reticle anchor pitch, and
the reticle test pattern fills the reticle test cell area of each of the reticle test cells.

11. The method of claim 10, wherein the reticle comprises:
a second monitoring pattern, wherein the second monitoring pattern includes a plurality of second test cells having a second test cell area and a second test pattern, wherein
the second test cell area is the same for each of the plurality of second test cells,
the second test pattern is the same type of test pattern except that the second test patterns of different first second cells have different pitch ratios with respect to the anchor pitch, and
the second test pattern fills the second test cell area of each of the second test cells;
the first and second monitoring patterns are disposed on a frame region of the reticle;
monitoring the second test pattern for reticle proximity monitoring during fabrication of the device; and
wherein the second test pattern is different from the first test pattern.

12. The method of claim 1 wherein first test pattern approximates the density variation of the real production-device.

13. The method of claim 1 wherein the first monitoring pattern comprises critical dimension to pitch (CDTP) ratios to the anchor pitch which-approximate the density of a SRAM device.

* * * * *